United States Patent [19]

Van Berkel et al.

[11] Patent Number: 5,005,136
[45] Date of Patent: Apr. 2, 1991

[54] SILICON-COMPILER METHOD AND ARRANGEMENT

[75] Inventors: Cornelis H. Van Berkel, Heeze; Ronald W. J. J. Saeijs, Eindhoven; Cornelis Niessen, Geldrop, all of Netherlands

[73] Assignee: U. S. Philips Corporation, New York, N.Y.

[21] Appl. No.: 156,392

[22] Filed: Feb. 16, 1988

[51] Int. Cl.$^5$ ............................................. G06F 15/60
[52] U.S. Cl. .................................... 364/490; 364/489; 364/488; 364/200
[58] Field of Search ............... 364/488, 489, 490, 491, 364/200, 900, 300

[56] References Cited

U.S. PATENT DOCUMENTS 4,703,435 10/1987 Darringer et al. .................. 364/488
4,827,427 5/1989 Hyetuke ............................ 364/489

OTHER PUBLICATIONS

"Verifying Compiled Silicon" by E. K. Cheng, VLSI Design, Oct. 1984, pp. 2-4.
"Silicon Compiler Lets System Makers Design Their Own VLSI Chips" by Stephen C. Johnson, Silicon Compilers Inc., Electronic Design, Oct. 4, 1984.

*Primary Examiner*—Parshotam S. Lall
*Assistant Examiner*—V. N. Trans
*Attorney, Agent, or Firm*—Anne E. Barschall

[57] ABSTRACT

A silicon-compilation method, a silicon-compiler arrangement, an abstract-circuit synthesis module usable in such arrangement, a machine-generated abstract circuit produced by such module, an electronic circuit generated by such method and a reset-free circuit produced by such arrangement. There are described a method and arrangement for silicon compilation. First, an algorithmic procedure to be executed by the electronic circuit is expressed in an imperative concurrent language. This, under execution of lexical, syntactic and semantic analysis is converted to a structure tree as an abstract representation of said procedure. This structure tree then is converted into an abstract circuit, wherein each basic component is a program module and each abstract channel corresponds to a program channel. Thereafter, the abstract circuit is converted into a concrete circuit, while obeying timing-organization constraints, circuitry-type constraints and technology constraints. Finally, the concrete circuit is converted into a very large-scale integrated-circuit layout.

13 Claims, 11 Drawing Sheets $S$ ::= skip | stop | $c?$ | $c!$ | $c?x$ | $c!E$ | $x := E$
    | $S_0; S_1$ | $S_0, S_1$ | $g \rightarrow S_0$ | $\neg g \rightarrow S_1$ | $(g \rightarrow S_0)^*; \neg g \rightarrow S_1$ | $*S$ $E$ ::= $k$ | $x$ | $\sim E$ | $E_0 \square E_1$ $var?(S)$ = the set of variables that may be accessed within (boolean) expressions within $S$ $var!(S)$ = the set of variables that may be assigned to within $S$ $chan?(S)$ = the set of input channels occurring within $S$ $chan!(S)$ = the set of output channels occurring within $S$ $IntChan(S)$ = $chan!(S) \cap chan?(S)$ $ExtChan(S)$ = $(chan!(S) \cup chan?(S)) - IntChan(S)$ $cond(S_0, S_1)$ =
$($  $var!(S_0) \cap var!(S_1) = \phi$
$\wedge$  $var!(S_0) \cap var?(S_1) = \phi$
$\wedge$  $var?(S_0) \cap var!(S_1) = \phi$
$\wedge$  $chan?(S_0) \cap chan?(S_1) = \phi$
$\wedge$  $chan!(S_0) \cap chan!(S_1) = \phi$
$)$

FIG. 2

$$S^\circ ::= S^\circ_{sync} \mid S^\circ_{sync}:S^* \mid S^\circ_0; S^\circ_1 \mid S^\circ_0, S^\circ_1 \mid S^\circ_0 \| S^\circ_1 \mid S^{\circ *}$$

$$S^\circ_{sync} ::= S^\circ_{comm} \mid S^\circ_{sync_0} \bullet S^\circ_{sync_1} \mid S^\circ_{sync_0} \| S^\circ_{sync_1}$$

$$S^\circ_{comm} ::= c?^\circ \mid c!^\circ \mid c?x^\circ \mid c!E^\circ$$

$$S^* ::= \text{skip}^* \mid \text{stop}^* \mid x := E^* \mid S^*_{sync} \mid S^*_0; S^*_1 \mid S^*_0, S^*_1$$
$$\mid g \to S^*_0 \| \neg g \to S^*_1 \mid (g \to S^*_0)^*; \neg g \to S^*_1 \mid *S^*$$

$$S^*_{sync} ::= S^*_{comm} \mid S^*_{sync_0} \bullet S^*_{sync_1}$$

$$S^*_{comm} ::= c?^* \mid c!^* \mid c?x^* \mid c!E^*$$

$$E ::= k \mid x \mid \sim E \mid E_0 \square E_1$$

$var?(S)$ = the set of variables that may be accessed within (boolean) expressions within $S$ $var!(S)$ = the set of variables that may be assigned within $S$ $chan?(S)$ = the set of input channels occurring within $S$ $chan!(S)$ = the set of output channels occurring within $S$ $chan^\circ(S)$ = the set of passive channels occurring within $S$ $chan^*(S)$ = the set of active channels occurring within $S$ $IntChan(S) = chan!(S) \cap chan?(S)$ $ExtChan(S) = (chan!(S) \cup chan?(S)) - IntChan(S)$ $cond(S_0, S_1) =$
$(\quad var!(S_0) \cap var!(S_1) = \phi \wedge var!(S_0) \cap var?(S_1) = \phi$
$\wedge \quad var?(S_0) \cap var!(S_1) = \phi$
$\wedge \quad chan?(S_0) \cap chan?(S_1) = \phi \wedge chan!(S_0) \cap chan!(S_1) = \phi$
$\wedge \quad chan^\circ(S_0) \cap chan^\circ(S_1) = \phi \wedge chan^*(S_0) \cap chan^*(S_1) = \phi$
$)$

FIG. 3

$*(i?x; m!x), *(m?y; o!y)$ $(s_0^\circ : (*(i?x^\circ; m_0!x^\circ), *(m_1?y^\circ; o!y^\circ))), (m_0?z^\circ \bullet m_1!z^\circ)^*$ $(s_0^\circ:(*(i?x^*; m_0!x^*), *(m_1?y^*; o!y^*))), (m_0?z^* \bullet m_1!z^*)^*$ ↦ {concurrent-command decomposition}

$(s_0^\circ:(s_1^\circ, s_2^\circ)), (s_1^\circ: *(i?x^*; m_0!x^*)), (s_2^\circ: *(m_1?y^*; o!y^*)), (m_0?z^* \bullet m_1!z^*)^*$

=

$\text{conc}(s_0, s_1, s_2), Buf1(s_1, i, m_0, x), Buf1(s_2, m_1, o, y), \text{pass}(m_0, m_1)$ where $Buf1(s, j, p, v)$

=

$s^\circ: *(j?v^*; p!v^*)$

↦ {repetitive-command decomposition}

$(s^\circ: * s_3^\circ), (s_3^\circ:(j?v^*; p!v^*))^*$

↦ {separation of variable $v$}

$(s^\circ: * s_3^\circ), (s_3^\circ:((j?v_0^* \bullet m_2!v_0^*); (m_3?v_1^* \bullet p!v_1^*))^*, (m_2?v^\circ \| m_3!v^\circ)^*$ ↦ {sequential-command decomposition}

$(s^\circ: * s_3^\circ), (s_3^\circ:(s_4^\circ; s_5^\circ))^*, (s_4^\circ:(j?v_0^* \bullet m_2!v_0^*))^*, (s_5^\circ:(m_3?v_1^* \bullet p!v_1^*))^*, (m_2?v^\circ \| m_3!v^\circ)^*$

=

$\text{rep}(s, s_3), \text{seq}(s_3, s_4, s_5), \text{trans}(s_4, j, m_2), \text{trans}(s_5, m_3, p), \text{var}(m_2, m_3)$

FIG. 12

| | | | |
|---|---|---|---|
| *memory components* | | | |
| const$(n,c)$ | constant | $(o!c^\circ)^*$ | $c$ |
| rom$(n,k,C)$ | constant array | $(i?x^\circ:o!C[x]^\circ)^*$ | $C$ |
| var$(n,k)$ | variable | $(i?v^\circ \parallel (o_0!v^\circ)^*,...,(o_{k-1}!v^\circ)^*)^*$ | $v$ |
| ram$(n,k)$ | variable array | $(i_0?x^\circ \bullet (i_1?A[x]^\circ \parallel o!A[x]^\circ))^*$ | $A$ |
| *communication components* | | | |
| pass $(n)$ | passivator | $(i?v^\circ \bullet o!v^\circ)^*$ | pass |
| pass | passivator | $(p_0^\circ \leftrightarrow p_1^\circ)^*$ | pass |
| trans $(n)$ | transferrer | $(p^\circ:(i?v^\circ \bullet o!v^\circ))^*$ | trans |
| mux$(n,k)$ | multiplexer | $((i_0?v^\circ \parallel .. \parallel i_{k-1}?v^\circ):o!v^\circ)^*$ | mux |
| dmux$(n,k)$ | demultiplexer | $((o_0!v^\circ \parallel .. \parallel o_{k-1}!v^\circ):i?v^\circ)^*$ | dmux |
| fork$(n,k)$ | fork | $(i?v^\circ:(o_0!v^\circ \bullet .. \bullet o_{k-1}!v^\circ))^*$ † | fork |
| merg$(n_0,..,n_{k-1})$ | merger | $((i_0?v_0^\circ \bullet .. \bullet i_{k-1}?v_{k-1}^\circ):o!(v_0,..,v_{k-1})^\circ)^*$ † | merg |
| split$(n_0,..,n_{k-1})$ | splitter | $(i?(v_0,..,v_{k-1})^\circ:(o_0!v_0^\circ \bullet .. \bullet o_{k-1}!v_{k-1}^\circ))^*$ † | split |
| *control components* | | | |
| skip | skipper | $(p^\circ:\text{skip}^\circ)^*$ | skip |
| stop | stopper | $(p^\circ:\text{stop}^\circ)^*$ | stop |
| seq$(k)$ | sequencer | $(p^\circ:(a_0^\circ;..;a_{k-1}^\circ))^*$ | ; |
| conc$(k)$ | concursor | $(p^\circ:(a_0^\circ,..,a_{k-1}^\circ))^*$ | , |
| sync$(k)$ | synchronizer | $(p^\circ:(a_0^\circ \bullet .. \bullet a_{k-1}^\circ))^*$ † | $\bullet$ |
| rep | repeater | $p^\circ: * a^\circ$ | $*$ |
| iter | iterator | $(p^\circ:(i?b^\circ;(b \rightarrow a^\circ;i?b^\circ)^*;\neg b \rightarrow \epsilon))^*$ | $*$ |
| mix$(k)$ | mixer | $((p_0^\circ \parallel .. \parallel p_{k-1}^\circ):a^\circ)^*$ | mix |
| sel$(n,c_0,..,c_{k-1})$ | selector | $(i?x^\circ:(x = c_0 \rightarrow a_0^\circ \parallel .. \parallel x = c_{k-1} \rightarrow a_{k-1}^\circ))^*$ | $\parallel$ |
| arbit$(k)$ | arbiter | $(p^\circ \bullet (p_0^\circ:a_0^\circ \parallel .. \parallel p_{k-1}^\circ:a_{k-1}^\circ))^*$ | $\parallel$ |
| *arithmetic components* | | | |
| and$(n,k)$ | conjunctor | $((i_0?b_0^\circ \bullet .. \bullet i_{k-1}?b_{k-1}^\circ):o!(b_0 \wedge .. \wedge b_{k-1})^\circ)^*$ † | $\wedge$ |
| or$(n,k)$ | disjunctor | $((i_0?b_0^\circ \bullet .. \bullet i_{k-1}?b_{k-1}^\circ):o!(b_0 \vee .. \vee b_{k-1})^\circ)^*$ † | $\vee$ |
| eq$(n)$ | equator | $((i_0?x_0^\circ \bullet i_1?x_1^\circ):o!(x_0 = x_1)^\circ)^*$ † | $=$ |
| inv$(n)$ | inverter | $(i?b^\circ:o!(\neg b)^\circ)^*$ † | $\neg$ |
| inc$(n)$ | incrementer | $(i?x^\circ:o!(x+1)^\circ)^*$ † | $-1$ |
| dec$(n)$ | decrementer | $(i?x^\circ:o!(x-1)^\circ)^*$ † | $+1$ |
| add$(n)$ | adder | $((i_0?x_0^\circ \bullet i_1?x_1^\circ):o!(x_0 + x_1)^\circ)^*$ † | $+$ |
| subt$(n)$ | subtractor | $((i_0?x_0^\circ \bullet i_1?x_1^\circ):o!(x_0 - x_1)^\circ)^*$ † | $-$ |
| comp$(n)$ | comparator | $((i_0?x_0^\circ \bullet i_1?x_1^\circ):o!(x_0 < x_1)^\circ)^*$ † | $<$ |
| mul$(n)$ | multiplier | $((i_0?x_0^\circ \bullet i_1?x_1^\circ):o!(x_0 * x_1)^\circ)^*$ † | $\times$ |
| shift$(n)$ | shifter | $((i_0?x_0^\circ \bullet i_1?x_1^\circ):o!(x_0 * 2^{x_1})^\circ)^*$ † | $<<$ |

† indicates *reversibility* of a basic component, i.e. its port activities may be reversed.

Table 1

SILICON-COMPILER METHOD AND ARRANGEMENT

1 INTRODUCTION

1.1 BACKGROUND OF THE INVENTION

The invention relates to a silicon-compilation method. Silicon compilation is a sequence of steps that are necessary to produce a silicon layout for an integrated circuit, when the function to be fulfilled by such circuit is specified. In case other substrate material were used, similar technology would apply, such as in the case of gallium-arsenic, and the invention is not limited to the use of silicon. In a less extended version, such silicon compiler would result in a recipe to thereafter make production of the layout elementary and straightforward. Such production would then imply insertion of transistor dimensions, processing parameters and other elementary quantities. The invention also relates to a silicon-compiler arrangement. Although various parts of the method could readily be executed by hand, in practice, the heart of such an arrangement would be a computer containing a general-purpose operating system inclusive of peripherals for executing a man-machine dialogue and a specific silicon-compiler program. The function of the arrangement is to accept a source text that defines a particular digital computation and to therefrom generate a detailed description of an integrated-circuit layout, so that the integrated circuit would execute the earlier defined computation. It has been concluded by the inventors that the language wherein the source text is expressed should provide constructs for explicit parallelism and also constructs for explicit sequentialism. Such languages are sometimes referred to as imperative-concurrent languages. Examples are the languages OCCAM, Ada, CSP and CCS, which have been extensively published. In these languages a designer may express which sub-computations need to be executed in parallel and which sub-computations need to be executed in series. It has been found that the combination of these two features allows for a silicon-compilation method providing freedom of architecture and choice for the intended target layout. Two small languages (named "CP-0" and "CP-1") exhibiting the essential features of imperative-concurrent languages will be described in Section 3.

1.2 SUMMARY OF THE INVENTION

It is an object of the invention to provide a silicon-compiler method and arrangement that can operate on a source text in an imperative concurrent language and produce a VLSI layout while keeping flexibility to a maximum and also allowing the result to be matched with a cost metric. The object is realized by a silicon-compiler arrangement. Such combination arrangement provides a succession of partial services that together constitute a production process, and as such, represents a powerful tool for developing and designing integrated circuits. Earlier in the art, the phrase "silicon compiler" had been used loosely for various set-ups that could produce layouts, but in those situations both the vertical integration of the system and the allowability of various algorithmic constructs were extremely limited. According to the present invention an extremely wide range of input algorithms is acceptable and the eventual realization technology imposes few, if any, constraints. Moreover, application of the teachings of the present invention produces a correctly operating circuit, and thus, fewer cycles through the (re)design-cum-processing cycle would be necessary. The price therefor would be a somewhat increased silicon area and/or possibly a somewhat lower operating speed.

1.3 FURTHER ASPECTS OF THE INVENTION

In particular, the provision of an abstract-circuit is considered to represent a central aspect of the invention. Therefore, the invention also relates to a module for providing an abstract-circuit representation.

The invention also relates to an abstract circuit generated according to the above. Such circuit could be an intermediate product of a layout fabrication, wherein the abstract circuit would be independent from any later step to be executed in the generation process.

The invention also relates to an electronic circuit generated according to the above. Both structurally and geometrically, the use of the abstract-circuit concept would translate into particular properties of the electronic circuit derived therefrom.

The invention also relates to a reset-free electronic circuit generated according to the above; it has been found that due to an implicit initialization mechanism of the abstract-circuit representation, no reset hardware would be necessary.

1.4 BRIEF DESCRIPTION OF THE FIGURES

The invention will be described in detail, in particular with respect to the appended figures that give a preferred embodiment, whereas the scope of the invention is given by the appended Claims. Now, FIG. 1 gives a decomposition of the silicon-compiler program;

FIG. 2 gives the syntax of language CP-0;

FIG. 3 gives the syntax of language CP-1;

FIGS. 4a–4c, 5a–5c and 6a–6b show examples of elementary abstract-circuit transformations as applied during abstract-circuit optimization;

FIG. 7 gives the concrete circuit of the basic component rep.

FIG. 8 gives the concrete circuit of the basic component seq.

FIG. 9 gives a representation of a two-place buffer in CP-0;

FIG. 10 is a block diagram of the two-place buffer;

FIG. 11 presents the translation of the two-place buffer from CP-0 to CP-1;

FIG. 12 presents the decomposition of the CP-1-version of the two-place buffer into basic components; the result of this decomposition is an abstract circuit;

FIG. 16 is a table which gives a list of various basic abstract-circuit components.

In general, the computer on which the silicon-compiler program would be running is not described hereinafter, as it may be of conventional build. The operating system that activates or deactivates certain parts of the silicon-compiler program and controls mutual synchronization on various levels among such parts may also be a conventional multiprocessing operating system; for convenience and brevity such computer and operating system are not explained further.

2 Structure of a Silicon-Compiler Arrangement

Figure 1:
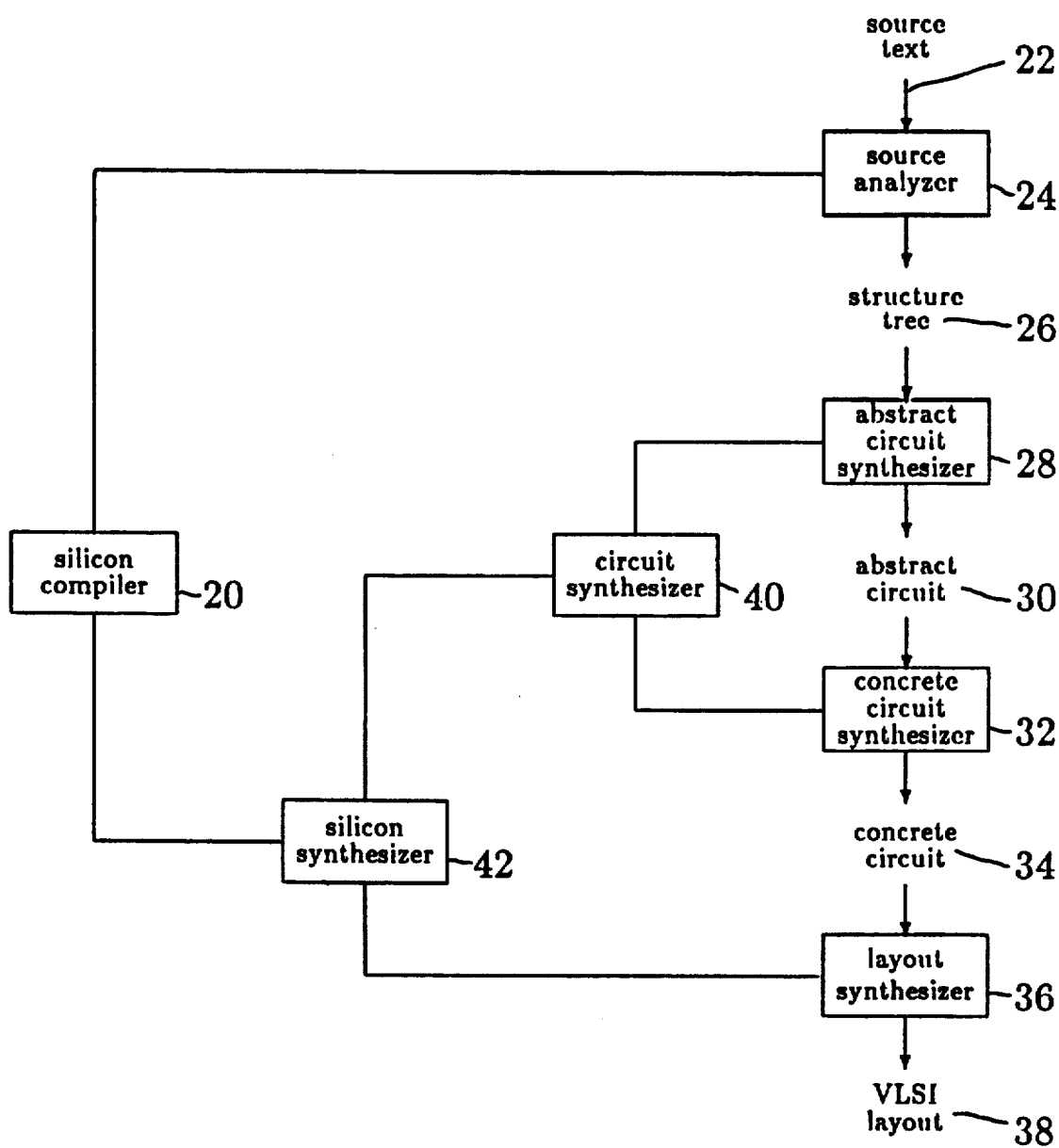

FIG. 1 gives a decomposition of a preferred embodiment of a silicon-compiler program. Modules have been indicated by blocks, input or output operations are linked thereto by means of small arrows. Blocks 20, 40, 42 have been decomposed each into two further blocks. Block 20 symbolizes the silicon-compiler program in general. A first subaltern block is source analyzer 24, that receives the source text. This analyzer module performs lexical, syntactic and semantic analysis, which, by virtue of the well-structured character of the source language, is a straightforward operation. By means of this analysis a so-called structure tree is created (26), which is an abstract representation of the source program and still defined in the concepts of the source language. This analysis is completely independent of the target language as represented by the intended IC technology. Therefore, the compiler technology required here may have a general character, and is not specific to silicon compilation. Thus, for brevity, no further explanation is given herein.

On a high level of the hierarchy the silicon synthesizer module 42 is decomposed into a circuit synthesizer module 40 and a layout-synthesizer module 36. The first one should provide a concrete circuit 34, the second one provides therefrom a VLSI-layout 38. Several low-level tasks, such as provision of additional drivers for driving capacitances that are inherent to long interconnecting wires are relegated to the layout-synthesizer module. The concrete circuit 34 may have any commensurate representation, such as by transistors in CMOS technology, gate circuits in TTL technology, or elementary logical expressions without reference to a technological realization, such as AND, OR, etcetera. Given such representation and the relegation of various low-level tasks to the layout-synthesizer module 36, the operation of the latter is a straightforward translation. The VLSI layout may be output in various different ways, such as a series of instructions for a plotter. In itself the latter is conventional.

The circuit-synthesizer module 40 is further decomposed into two partial circuit-synthesizer modules, the first one 28 converting the structure tree into a so-called abstract circuit 30, the second one 32 therefrom producing a concrete circuit. An abstract circuit is a network composed of basic components, interconnected by abstract channels and satisfying certain composition rules.

Module 32 executes the conversion from the abstract circuit to the concrete circuit 34. This conversion is executed under constraints of various technological choices relevant to the intended VLSI circuits. Major choices to be made relate to timing organization (e.g. clocked, asynchronous or delay-insensitive)

circuitry type (e.g. dynamic logic, static logic)

technology realization (e.g. bipolar, MOS or Gallium arsenic).

The conversion from an abstract circuit to a concrete circuit is straightforward in that elements of an abstract circuit translate into corresponding elements of a concrete circuit according to the following:

Each channel of the abstract circuit is translated into a physical interconnection in the concrete circuit, i.e. a bundle of wires. The number of wires depends on whether values are communicated along the channel and, if so, the value width.

Each non-parameterized basic component of the abstract circuit is translated into a fixed sub-circuit of the concrete circuit.

Each parameterized basic component of the abstract circuit is translated into a sub-circuit of the concrete circuit that is composed of a number of fixed circuit parts in a regular way.

3 Communicating Processes

As an example of an imperative-concurrent programming language we present CP-0 ("Communicating Processes-level 0"). Abstract circuits will be described in CP-1 ("Communicating Processes-level 1"), a language similar to CP-0, but with fundamentally different "interval" semantics.

The sections on abstract circuits and on abstract-circuit synthesis will refer to the CP-0 and CP-1 descriptions below.

3.1 CP-0

We first present the syntax of CP-0. CP-0 is essentially a subset of the widely published and studied language CSP.[12]

[1]C.A.R. Hoare. Communicating Sequential Processes. Communications of the ACM, 21(8): 666–677, 1978.
[2]C.A.R. Hoare. Communicating Sequential Processes. Series in Computer Science, Prentice-Hall International, 1985.

We use six syntactic categories, viz.

the set Const of constants (with typical element k), the set Var of variables (with typical element x), the set Exp of expressions (with typical elements E, $E_0$, $E_1$), the set Bexp of boolean expressions (with typical element g), the set Chan of channels (with typical element c), and the set Cmd of commands (with typical elements S, $S_0$, $S_1$)

The production rules of commands and expressions are given in FIG. 2. This figure also includes definitions of internal and external channels of a command S (IntChan(S) and ExtChan(S) respectively). A CP-0 program is a command.

The various command forms are explained below (operationally and informally):

skip is an atomic command: its execution has no effect whatsoever, but terminates successfully.

stop is also an atomic command: its execution has no effect whatsoever, but does not terminate.

c! is a so-called nonput command; its execution is equivalent to synchronization with a corresponding nonput command c?. Communication between nonput commands is called non-value communication and is undirected. The suggested asymmetry between c? and c! is artificial; its introduction facilitates the presentation of the translation into CP-1.

c?v is an input command; its execution has two effects: synchronization with the corresponding output command c!E, and assignment of the value of the output expression E to variable v. Communication between input and output commands is called value communication and is directed, viz. from output to input.

c!E is an output command (see above).

v:=E is an assignement command; after its execution variable v has the value of expression E.

$S_0; S_1$ amounts to the sequential execution of commands $S_0$ and $S_1$.

$S_0, S_1$ amounts to the concurrent execution of commands $S_0$ and $S_1$. The commands must satisfy condition cond($S_0, S_1$) (cf. FIG. 2).

$g \to S_0 \mathbin{[\!]} \neg g \to S_1$ amounts to the execution of either $S_0$ (if $g$ holds) or $S_1$ (if $\neg g$ holds).

$(g \to S_0)^*; \neg g \to S_1$ amounts to zero, one or more executions of $S_0$ (while $g$ holds) and subsequent execution of $S_1$.

*S is a shorthand for (true→S)*; false→skip and amounts to repeating S "forever".

Communication actions require simultaneous participation of both processes involved; the actual occurrence of each communication event should be regarded as an instantaneous atomic action without duration. Communication in CP-0 is perfectly symmetric with respect to the initiative to communicate. Of course, a possible asymmetry may exist with regard to the direction of the communication.

Furthermore, parentheses are used in the usual way, and the binding powers of the various binary operators increase from the bar "$[\!]$", the arrow "→", the semicolon ";" to the comma "," (i.e. from the larger symbol to the smaller symbol). The star as unary operator has the highest binding power.

The syntax of Bexp is that of Exp. We assume that (boolean) expressions are of an elementary kind (cf. expressions in a programming language such as Pascal); in particular, they have no side effects and their evaluation always terminates. Expressions have the form of constants (e.g. true, 0,4, maxint,$\phi$), variables, or are composed of more elementary expressions using unary operators (e.g. not) and/or binary operators (e.g. $\wedge, \vee, =, \neq, \leq, \max, \min, +, -, *, \text{div}, \varepsilon, \cup$ and $\cap$). Some form of data typing and type coercion is assumed.

CP-0 is kept very small for the purpose of demonstrating its key features; numerous extensions and notational shorthands may be considered for enhancing CP-0 programming convenience. A short, incomplete, list is presented:

naming of commands for the purpose of multiple instantiation and program structuring (cf. components or processes), with appropriate renaming facilities for channel names naming of (boolean) expressions (cf. functions)

scoping of names introduction of data types (cf. Pascal)

introduction of parallel assignments, parallel inputs and parallel outputs introduction of broadcast introduction of general guarded commands and/or case commands introduction of tail-recursive commands These extensions can be accommodated for in the abstract-circuit synthesis method without fundamental problems.

3.2 CP-1

CP-1 is a small imperative-concurrent language akin to CP-0. The fundamental difference between CP-0 and CP-1 lies in the structure of communications. Whereas in CP-0 communications are instantaneous and symmetric (with regard to the initiative to communicate) events, in CP-1 communications have a duration and are represented by asymmetric intervals. Both asymmetry and duration are in closer agreement with the physics of communication. Moreover, asymmetric intervals can be ordered in time in more ways than symmetric events; these additional ways of order appear very useful.

Communications are either passive or active. Active communications are initiated by the process, passive communications by the environment of the process. This distinction is independent of the distinction between input and output; thus we may have passive input, active input, passive output and active output. In a CP-1 command, passive (active) communications are identified with passive (active) communication commands. A process uses a channel either exclusively for active communications or exclusively for passive communications. Therefore we speak of active and passive channels as well.

Composition of active and passive communication commands is restricted for reliable implementation; e.g. in implementing the sequential composition of a passive input followed by an active input it is difficult to guarantee a strict sequential order of both communications. In order to formalize these restrictions we have generalized the notion of passive (active) communication commands to other (structured) commands as well; as a result, most restrictions are captured syntactically in FIG. 3. Six syntactic categories are introduced for commands: $S_{comm}^\bullet$ (active communication commands), $S_{sync}^\bullet$ (active sync commands), $S^\bullet$ (active commands), $S_{comm}^\circ$ (passive communication commands), $S_{sync}^\circ$ (passive sync commands), and $S^\circ$ (passive commands). Passive commands are super-scripted with a circle as in $S^\circ$, active commands with a bullet as in $S^\bullet$.

The operators $[\!]$ "", "→", ";" and "," have the same purpose as their counterparts in CP-0. Two new operators are introduced: the bullet "•" and the colon ":". Before we explain their meaning, we first need to introduce the notion of sync command. A passive (active) sync (from synchronization) command is composed of passive (active) communication commands. The involved communications of a sync command occur synchronously in that the corresponding intervals overlap; i.e. there is a moment in time when all communications involved have been initiated but none terminated. Moreover, we may define the sync interval as the time interval in which all involved communications have been initiated but none terminated. The bullet composition of two sync commands is again a sync command, with both sync intervals overlapped. The colon composition of a passive sync command and an arbitrary active command results in a passive command where the execution of the active command is completely enclosed in the sync interval of the sync command.

A final, but important, difference with CP-0 is in the choice commands. Whereas in CP-0 a choice between commands is based on the boolean value of the guard expressions, CP-1 allows a choice also to be made between the first passive communications of two (passive) commands. Thus in $S = S_0^\circ [\!] S_1^\circ$ the choice between $S_0$ and $S_1$ is decided by the environment of S by selecting between the first communication actions of $S_0$ and $S_1$, provided that these first communications are distinct.

The concurrent composition of $S_0$ and $S_1$ must satisfy cond($S_0, S_1$) (cf. FIG. 3).

The remarks on extensions and notational shorthands made with regard to CP-0 equally hold for CP-1.

4 Abstract Circuits

An abstract circuit is a network of basic components, mutually connected by channels, satisfying certain composition rules.

An abstract circuit can be viewed in two ways. On the one hand, an abstract circuit is a network. This view is particularly useful for considering concrete-circuit synthesis. On the other hand, an abstract circuit directly corresponds with a CP-1 program, composed from elementary CP-1 programs. This view is particularly useful for considering abstract-circuit synthesis. How program composition relates to network composition is discussed in the first sub-section.

4.1 Components and Composition

Consider a CP-1 program S*. If S* is of the form $$S_0^*, S_1^*, \ldots, S_{m-1}^*$$

then $S_0^*, S_1^*, \ldots, S_{m-1}^*$ are called actual components of S*. If a channel c occurs in both $S_i$ and $S_j$, then we say that components $S_i$ and $S_j$ are connected by means of channel c. (Note that c cannot occur in more than two components). Of two connected components, one component has active occurrences of c only (and this component is called the active side of the channel) whereas the other has passive occurrences of c only (the passive side of the channel).

For practical purposes we introduce a renaming procedure that enables us to consider different actual components with the same structure as instances of the same formal component. A formal component f is represented by a CP-1 program $S_f$ in isolation. The external channels occurring in $S_f$ are called ports of f. Based on the analogy of channels, one may speak of the activity, direction, etc. of ports. Actual components (with unique instance names) are obtained by renaming $S_f$ as follows:

Variable names etc. are labeled with the instance name so as to make them strictly local for each instance.

Port names are replaced by names of (actual) channels (we say that the ports are connected to the corresponding channels).

A CP-1 program composed of a number of components corresponds with a network in the following way: CP-1 program components correspond with network components, CP-1 channels connecting program components correspond with abstract channels connecting ports of network components.

An abstract circuit corresponds with a CP-1 program of a restricted form, viz. a composition of instances of so-called basic components. In discussing abstract circuits we will speak of "components" and "channels" in a general sense, without making a distinction between the program aspect and the network aspect of abstract circuits.

4.2 Basic Components

A basic component b is an elementary component with CP-1 command $S_b^*$. Basic components have no internal channels, i.e. $S_b^*$ satisfies $$chan^*(S_b^*) \cap chan^\circ(S_b^*) = \phi$$

For CP-1 commands of basic components we restrict the data types of channels and variables. We only consider boolean vectors existing of a positive number of bits. The number of bits is called the width of the corresponding channels and variables. We assume that any other data type can be mapped into boolean vectors of some fixed length.

Some basic components are parameterized in one or more of the following ways:

Structural parameterization: the number of ports in a class of equivalent ports is a parameter.

Data parameterization: the width of a group of variables and ports is a parameter.

Reversibility: the activity of ports may be a parameter, namely a so-called reversible component may have all its port activities reversed.

For the translation of CP-0 programs into abstract circuits the following set of basic components is sufficient:

var(n,k) = $(i?v^* [ (o_0!v^*)^*, \ldots, (o_{k-1}!v^*)^*)^*$: an n-bit variable component with an input port i for writing and k output ports $o_0, \ldots, o_{k-1}$ for concurrent reading.

const(n,c) = $(o!c^*)^*$: a constant component that outputs an n-bit constant value c on its only port o.

pass(n) = $(i?v^* \bullet o!v^*)^*$: an n-bit passivator with passive input i and passive output o for connecting an active source and an active destination. For non-value channels the passivator command is $(p_0^* \bullet p_1^*)^*$.

trans(n) = $(p^*:(i?v^* \bullet o!v^*))^*$: an n-bit transferrer that, controlled by an interval on port p, actively inputs a message on port i and actively outputs it on port o.

mux(n,k) = $((i_0?v^* [ \ldots [ i_{k-1}?v^*):o!v^*)^*$: an n-bit multiplexer that actively outputs a message on port o that is received on one of its k passive input ports $i_0, \ldots, i_{k-1}$.

dmux(n,k) = $((o_0!v^* [ \ldots [ o_{k-1}!v^*):i?v^*)^*$: an n-bit demultiplexer that actively inputs a message on port i that is requested on one of its k passive output ports $o_0, \ldots, o_{k-1}$.

seq(k) = $(p^*:(a_0^*; \ldots ; a_{k-1}^*))^*$: a sequencer controlled by an interval on port p, for activating sequentially k ports $a_0, \ldots, a_{k-1}$.

conc(k) = $(p^*:(a_0^*, \ldots, a_{k-1}^*))^*$: a concursor controlled by an interval on port p, for activating concurrently k ports $a_0, \ldots, a_{k-1}$.

mix(k) = $((p_0^* [ \ldots [ p_{k-1}^*):a^*)^*$: a mixer for activating a port a, alternatively controlled by an interval on one of k passive ports $p_0, \ldots, p_{k-1}$.

iter = $(p^*:(i?b^*;(b \to a^*;i?b^*)^*; \neg b \to \epsilon))^*$: an iterator controlled by an interval on port p, for iteratively activating a port a for as long as a boolean value b actively inputted on port i is true.

rep = $p^*:{}^*a^*$: a repeater controlled by an interval on port p, for activating a port a infinitely often.

sel(n,$c_0, \ldots, c_{k-1}$) = $(i?x^*:(x = c_0 \to a_0^* [ \ldots [ x = c_{k-1} \to a_{k-1}^*))^*$: a selector for selecting one of k active ports $a_0, \ldots, a_{k-1}$ depending on the n-bit value from input port i.

una = $(i?b^*:o!(\sim b)^*)^*$: a reversible unary operator that outputs on port o the result of a unary operation $\sim$ on the input value from port i.

bin = $((i_0?x_0^* \bullet i_1?x_1^*):o!(x_0 \square x_1)^*)^*$: a reversible binary operator that outputs on port o the result of a binary operation $\square$ on the input values from ports $i_0, i_1$.

skip = $(p^*:skip^*)^*$: a skipper that does nothing except participating in an interval on its only port p.

stop = $(p^*:stop^*)^*$: a stopper that does nothing, not even terminating an interval on its only port p.

In the table in FIG. 16 inv, inc, dec are given as examples of unary operators and and, or, eq, add, mul, shift as examples of binary operators.

For practical purposes, it is useful to extend the set of basic components with the following extra components (see the table in FIG. 16):

special (cheaper) realizations for optimization (replacing combinations of basic components from the original set): fork, sync.

components that are useful for extensions of CP-0: rom, ram, merg, split, arbit, and additional arithmetic components (e.g. other, in general n-ary, operators).

For drawing abstract circuits the following convention is used:

Basic components are drawn as large circles labeled with the symbol given in the rightmost column of the table in FIG. 16.

Ports of basic components are drawn as small circles on the boundary of the large circles of basic components. Active ports have filled circles (●); passive ports have open circles (○).

Channels are drawn as lines between ports. Communication channels are given a direction from output towards input; synchronization channels are undirected.

4.3 Composition Rules for Abstract Circuits

Abstract circuits must satisfy two composition rules: an abstract circuit must be acyclic and conflict-free. Acyclicity and conflict-freeness are structural properties of abstract circuits and have been derived from syntactic properties of CP-1 programs that are sufficient for delay-insensitivity. Moreover, they are important premises for the initializability of abstract circuits.

Acyclicity is most easily expressed in terms of the activity graph of an abstract circuit, which is a directed graph defined as follows:

each basic component corresponds with a vertex of the activity graph.

each channel between two basic components corresponds with an arc directed from the vertex corresponding with the active side of the channel towards the vertex corresponding with the passive side of the channel.

The activity graph of an abstract circuit must be acyclic, i.e. contain no directed cycles (where a cycle is defined according to standard graph theory).

In general, conflict-freeness represents the idea that if the command $S_b^*$ of a basic component b implies a certain ordering of passive intervals (e.g. that two intervals may not overlap) then the (active) environment must respect this ordering. In particular, conflict-freeness of an abstract circuit is a structural property that is sufficient for general conflict-freeness.

4.4 Delay-Insensitivity of Abstract Circuits

Abstract circuits are delay-insensitive. Delay-insensitivity means that the correct operation of an abstract circuit does not depend on the relative delays of channels and/or basic components.

We define delay-insensitivity as a property for CP-1 programs in general. CP-1 programs corresponding with abstract circuits satisfy this property.

For the definition of delay-insensitivity of a CP-1 program $S^*$ consider the following transformation of $S^*$:

For each non-value channel c in $S^*$ we introduce two new channels $c_0$, $c_1$: all occurrences of $c^*$ in $S^*$ are replaced by $c_0^*$, all occurrences of $c^*$ are replaced by $c_1^*$, and the command $(c_0^*; c_1^*)^*$ is composed in parallel. If c is an external passive (active) channel, we take $c_0$ ($c_1$) equal to c.

For each value channel c with active output in $S^*$ we introduce new channels $c_0$, $c_1$: all occurrences of $c!^*$ in $S^*$ are replaced by $c_0!^*$, all occurrences of $c?^*$ are replaced by $c_1?^*$, and the command $(c_0?v^*; c_1!v^*)^*$ is composed in parallel. If c is an external passive (active) channel, we take $c_0$ ($c_1$) equal to c.

For each value channel c with active input in $S^*$ we introduce new channels $c_0$, $c_1$: all occurrences of $c?^*$ in $S^*$ are replaced by $c_0?^*$, all occurrences of $c!^*$ are replaced by $c_1!^*$, and the command $(c_0!v^*: c_1?v^*)^*$ is composed in parallel. If c is an external passive (active) channel, we take $c_0$ ($c_1$) equal to c.

CP-1 program $S^*$ is delay-insensitive if the above transformation yields an equivalent CP-1 program (calling two CP-1 programs equivalent when their behaviors at their external channels are indistinguishable).

4.5 Initialization

The meaning of the CP-1 command of a basic component or an abstract circuit can be expressed in terms of a finite-state machine. The concrete circuit that implements this finite-state machine is a sequential electronic circuit. After power-on such an electronic circuit may be in any state, even in a state that has no equivalent in the finite-state machine. Therefore a means for initialization, i.e. for forcing the circuit in its initial state, is indispensable. Usually this is done by performing a so-called reset which uses additional circuitry distributed throughout the circuit.

For abstract circuits the following effective and efficient initialization procedure does not require such additional reset circuitry. However, this procedure introduces an additional constraint for the concrete circuit implementations of the basic components.

Before we present the initialization procedure we make a number of observations:

1. We may abstract from the values of all variables occurring in the commands of the basic components: the meanings of the commands do not rely on the initial values of the variables.

2. Once an abstract circuit is in its initial state, it will stay there until the environment initiates an interval at one of its passive external ports. This is a direct consequence of the fact that abstract circuits are passive.

3. Let the initial state of a port be the state in which all initiated intervals also have been completed. Then each basic component has the property that it is in its initial state when all its ports are in their initial states. This is a consequence of our choice of the set of basic components, not of our formalism.

4. When all external ports of an abstract circuit are in their initial states, one may not conclude that the circuit is in its initial state.

The third observation is the key to our initialization procedure. The problem is that we have no direct control over the internal ports of the abstract circuit. Even the control over the state of the external ports is limited: only the electrical inputs of the external ports can be controlled.

Let the state of a port be denoted by the pair (i,o) where i and o refer to the electrical inputs and outputs respectively. The set of values over which i and o may range depends on the direction and width of the port, as well as on the concrete representation of values of messages. Both sets of values have one special value '0', such that (0,0) corresponds with the initial state of the port.

A concrete circuit implementation of a basic component having both passive and active ports satisfies the initialization constraint if:

1. within a finite and known amount of time after the electrical inputs of all passive ports were given the stable value 0, the electrical outputs of all active ports get a stable value 0, 2. subsequently, within a finite and known amount of time after the electrical inputs of all active ports were given the stable value 0, the electrical outputs of all passive ports get a stable value 0, and thus all ports have the state (0,0).

A concrete circuit implementation of a basic component having only passive ports satisfies the initialization constraint if within a finite and known amount of time after the electrical inputs of all ports were given the stable value 0, the electrical outputs of all ports get a stable value 0.

When all basic components satisfy this initialization constraint, an abstract circuit can be initialized by giving the values of the electrical inputs of all external ports the stable value 0. Within a finite and predictable amount of time the electrical outputs of all external ports get a stable value 0 and all internal ports are in their initial state as well: the abstract circuit is in its initial state.

Acyclicity of abstract circuits and the fact that the commands of abstract circuits and basic components are passive play a crucial role in the proof of the effectiveness of this initialization procedure.

5 Abstract-Circuit Synthesis

Abstract-circuit synthesis is the transformation of a CP-0 program (represented by a structure tree) into an (efficient and) equivalent abstract circuit. A CP-0 program and an abstract circuit are equivalent when their behaviors at their respective external channels are indistinguishable apart from the distinction between atomic events and (time) intervals.

This transformation consists of three successive sub-transformations:
1. the translation of a CP-0 program into an "equivalent" CP-1 program;
2. the decomposition of the CP-1 program into an "equivalent" abstract circuit (i.e. a CP-1 program constructed from basic components);
3. the optimization of the abstract circuit into an "equivalent", but "cheaper" abstract circuit.

The three steps, as well as the notions "equivalent" and "cheaper" will be discussed in three sub-sections.

5.1 Translation

The translation from a CP-0 command S into an equivalent CP-1 command comprises three steps:
1. The CP-0 command S is converted into an active command $S^*$ by recursively converting its sub-commands into active commands (up to and including all its atomic commands). This is straightforward, since the syntax of S in CP-0 and the syntax of $S^*$ in CP-1 are isomorphic. The resulting command is not yet a CP-1 command, because it is active and it generally does not obey condition cond($S_0^*$, $S_1^*$) for concurrent $S_0^*$ and $S_1^*$ (cf. FIG. 3).
2. $S^*$ is converted into a passive command by prefixing it with $s_0^*$: ($s_0$ is called the initiation channel of $S^*$, i.e. the environment may initiate $S^*$ by an active communication on the non-value channel $s_0$).
3. The conflict between activities on internal channels is resolved as follows:
   (a) for each internal channel c in $S^*$ two new channels are introduced, viz. c0 and c1,
   (b) each active output command c!E$^*$ is replaced by C0!E$^*$ and each active input command c?x$^*$ by c1?x$^*$ (c0!$^*$ and c1?$^*$ may be abbreviated as c0$^*$ and c1$^*$)
   (c) for each channel pair (c0, c1) a command (c0?v$^*$•c1!v$^*$)$^*$ (the basic component pass) is introduced and composed in parallel with $s0^*$:$S^*$. When no value is passed the passivator becomes symmetric: (c0$^*$•c1$^*$)$^*$ The resulting command is indeed a valid CP-1 command, and has the form $(s_0^*:S^*)$,PASS where PASS denotes the set of introduced basic components of type pass.

5.2 Decomposition

Decomposition of a CP-1 command (of the form resulted from the CP-0 to CP-1 translation) into a network of basic components comprises four successive decomposition steps: variable separation, channel decomposition, command decomposition and expression decomposition.

5.2.1 Variable Separation

Variable separation is realized by the following steps:
1. for each assignment in $S^*$ of the form x:=E(x)$^*$, where E(x) is an expression in which variable x is referenced, an auxiliary variable and assignment are introduced: x:=E(x)$^*$ is replaced by x0:=E(x)$^*$; x:=x0$^*$, where x0 is a new auxiliary variable (in order to prevent concurrent read and write actions in variable x)
2. for each choice command in $S^*$ of the form $g \to S_0 [] g \to S_1$ for which var?(g)∩(var!$S_0$ ∪var!$S_1$)≠φ, an auxiliary variable and assignment are introduced: $g \to S_0 [] g \to S_1$ is replaced by $g0:=g;(g0\to S_0 [] g0\to S_1)$ where g0 is a new auxiliary boolean variable (in order to prevent concurrent read and write actions in a variable of var?(g))
3. for each variable x (including auxiliary variables) in $S^*$ a basic component x of type var is introduced with write port x.i and read port x.o
4. each assignment x:=E$^*$ is replaced by an output command x.i!E$^*$
5. each input command c?x$^*$ is replaced by the command c?v$^*$•x.i!v$^*$
6. each output of a (boolean) expression E on channel c, viz. c!E($x_0, x_1, \ldots, x_{n-1}$)$^*$ (in which $\{x_0, x_1, \ldots, x_{n-1}\}$ is the set of variables referenced in E) is replaced by the following so-called active-expression command:

$(x_0.o?v_0^*\bullet x_1.o?v_1^*\bullet \ldots \bullet x_{n-1}.o?v_{n-1})\bullet c!E(v_0, v_1, \ldots, v_{n-1})^*$ which is abbreviated as X?V$^*$•c!E(V)$^*$, where V denotes the set variables $\{v_0, v_1, \ldots, v_{n-1}\}$.

The resulting command is a valid CP-1 command, and has the form $(s_0^*:S^*)$,PASS, VAR where VAR denotes the set of introduced basic components of type var.

5.2.2 Channel Decomposition

Each internal channel in ($s_0^*$:$S^*$),PASS, VAR is referenced twice or more, viz. once passively in a pass or var component in P ASS∪V AR, and once or more times actively in $S^*$. The purpose of channel decomposition is to transform $S^*$ such that each internal channel is referenced exactly once actively and once passively. For each internal channel c referenced more than once actively (say K times), two steps are applied. Firstly, the K active references to channel c are made unique by renaming them: $c1 \ldots cK$; the (unique) passive reference is renamed $c0$. Secondly, 1. in case c is a nonput channel, a basic component of type mix is introduced with its active port connected to $c0$ and its K passive ports connected to $c1 \ldots cK$.
2. in case the active references to c are outputs, a basic component of type mux is introduced with its active output port connected to $c0$ and its K passive input ports connected to $c1 \ldots cK$.
3. in case the active references to c are inputs and the corresponding passive reference is not part of a var component, a basic component of type dmux is introduced with its active input port connected to $c0$ and its K passive output ports connected to $c1 \ldots cK$.
4. in case the active references to c are inputs and the corresponding passive reference is part of a var component, the number of (passive) read ports of that var component is extended to K and these ports connected to $c1 \ldots cK$.

The resulting command is a valid CP-1 command, and has the form $$(s_0^*:S^*),PASS, VAR, MIX, MUX, DMUX$$

where MIX, MUX and DMUX denote the sets of introduced basic components of type mix, mux and dmux; each internal channel in the above command is exactly referenced once passively and once actively.

5.2.3 Command Decomposition

Command decomposition deals with the decomposition of commands of the form $c^*:S^*$ into basic components and passive-expression commands (see below). First we observe that $(c^*:S^*)^*$ is a valid implementation for $c^*:S^*$ (after completion of $S^*$, which can be observed from the completion of $c^*$, the environment may even restart $S^*$). The decomposition of $(c^*:S^*)^*$ is treated for the nine possible forms of the active command $S^*$ separately (assignment commands have been eliminated during variable separation). Let $c0$ and $c1$ be two new nonput channels:

1. $(c^*:skip^*)^*$ is the basic component skip
2. $(c^*:stop^*)^*$ is the basic component stop
3. $(c^*:c0^*)^*$, with $c0$ a nonput channel, is not further decomposed; instead, the passive reference to $c0$ is renamed c and $(c^*:c0^*)^*$ is eliminated (cf. remark on delay-insensitivity in Section 4.2)
4. $(c^*:(X?V^* \bullet c0!E(V)^*))^*$ is decomposed into $$(c^*:(c1?v^* \bullet c0!v^*))^*,(X?V^*:c1!E(V)^*)^*$$

The first command is a trans basic component, the second command is a so-called passive-expression command, and its decomposition is treated in a next subsection.

5. $(c^*:(S_0^*; S_1^*))^*$ is decomposed into $$(c^*:(c0^*; c1^*))^*,(c0^*:S_0^*)^*,(c1^*:S_1^*)^*$$

The first command is a seq basic component.
6. $(c^*:(S_0^*, S_1^*))^*$ is decomposed into $$(c^*:(c0^*, c1^*))^*,(c0^*:S_0^*)^*,(c1^*:S_1^*)^*$$

The first command is a conc basic component.
7. $(c^*:(g \to S_0^* \| g \to S_1^*))^*$, is decomposed into $$(c^*:(g \to c0^* \| g \to c1^*))^*,(c0^*:S_0^*)^*,(c1^*:S_1^*)^*$$

The first command is a sel basic component.
8. $(c^*:((g \to S_0^*)^*; \neg g \to S_1^*))^*$ is decomposed into $$(c^*:((g \to c0^*)^*; \neg g \to c1^*))^*,(c0^*:S_0^*)^*,(c1^*:S_1^*)^*$$

The first command is a iter basic component.
9. $(c^*:{}^*S^*)^*$ is decomposed into $$(c^*:{}^*c0^*),(c0^*:S_0^*)^*$$

The first command is a rep basic component. Note that $(c^*:{}^*S^*)^*$ is equivalent with $(c^*:{}^*S^*)$.

The resulting command is a valid CP-1 command, and has the form

EXP, PASS, VAR, MIX, MUX, DMUX, SKIP, STOP, TRANS, SEQ, CONC, SEL, ITER, REP where EXP denotes a set of passive-expression commands to be decomposed further, and where SKIP, STOP, TRANS, SEQ, CONC, SEL, ITER, and REP denote the sets of introduced basic components of types skip, stop, trans, seq, conc, sel, iter, and rep respectively.

5.2.4 Expression Decomposition

The last decomposition step deals with the decomposition of passive-expression commands of the form $(X?V^*:c!E(V)^*)^*$. The decomposition is treated for the four possible forms of the passive-expression commands separately. Let $c0$ and $c1$ be two new channels:

1. $c!k^{**}$ is not further decomposed, since it has the form of a basic component of type const, with constant value k, and with its passive port connected to channel c.
2. $(x.o?v^*:c!v^*)^*$ is not further decomposed; instead, the passive counterpart reference to $x.o$ is renamed c and $(x.o?v^*:c!v^*)^*$ is eliminated (cf. remark on delay-insensitivity in Section 4.4)
3. $(X?V^*:c! \sim E(V)^*)^*$, where $\sim$ denotes an arbitrary unary operator is decomposed into $$(c0?v^*:c! \sim v^*)^*,(X?V^*:c0!E(V)^*)^*$$

The first command is an instance of the basic component realizing the unary operation corresponding with operator $\sim$.
4. $(X?V^*:c!(E0(V0) \Box E1(V1))^*)^*$, with $V=V0 \cup V1$, and where $\Box$ denotes an arbitrary binary operator is decomposed into $$((c0?v0^* \bullet c1?v1^*):c!(v0 \Box v1)^*)^*,(X0?V0^*:c0!E0(V0)^*)^*,$$

$$(X1?V1^*:c1!E1(V1)^*)^*$$

where $X=X0 \cup X1$. The first command is an instance of the basic component realizing the binary operation corresponding with operator $\Box$.

The resulting command is a valid CP-1 command, and, more particularly, an abstract circuit of the form

PASS, VAR, MIX, MUX, DMUX, SKIP, STOP, TRANS, SEQ,

-continued

CONC,SEL,ITER,REP,CONST,UNA,BIN where CONST, UNA and BIN denote the sets of introduced basic components of type const, unary operators and binary operators respectively.

This completes the decomposition of a CP-1 command (of the form resulted from the CP-0 to CP-1 translation) into an abstract circuit.

5.3 Abstract-Circuit Optimization

An optimization of an abstract circuit is a transformation of the abstract into an equivalent, "cheaper" abstract circuit, according to some cost criterion. This transformation has the form of a sequence of elementary (abstract-circuit) transformations.

5.3.1 Costs of an Abstract Circuit

Various cost criteria may be considered for abstract circuits: e.g. the number of components or the number of channels. However, in practice we may be more interested in the costs of the corresponding concrete circuits, such as circuit size, circuit speed and dissipation. We assume that the relevant cost criteria are reflected in a given cost function returning a real cost value for a given abstract circuit. It is this cost function that decides whether a given abstract-circuit transformation is an optimization or not. An example of a simple and useful cost function is one that returns the transistor count of a corresponding concrete (e.g. CMOS) circuit.

5.3.2 Elementary Transformations

An (abstract-circuit) transformation can be formulated as the substitution of a sub-circuit by another circuit. We will consider only transformations in which the removed sub-circuit and the inserted circuit are equivalent. Of each pair of equivalent circuits, generally, one is the cheaper, depending on the cost criterion at hand. An elementary transformation cannot be formulated in terms of other elementary transformations.

The set of elementary transformations depends on the available basic components. A heuristically produced set of useful transformations is given hereinafter. A basic theme is that of "sharing" basic components, to the effect that either an expensive basic component is time-shared, or that the channel structure around the shared component is simplified.

The usefulness of elementary transformations that aim at sharing basic components stems from our syntax-directed decomposition method, since CP-1 sub-commands are decomposed independently. Also, the boundaries of independently decomposed program parts often show inefficiencies that suggest elementary transformations.

Figure 4A:
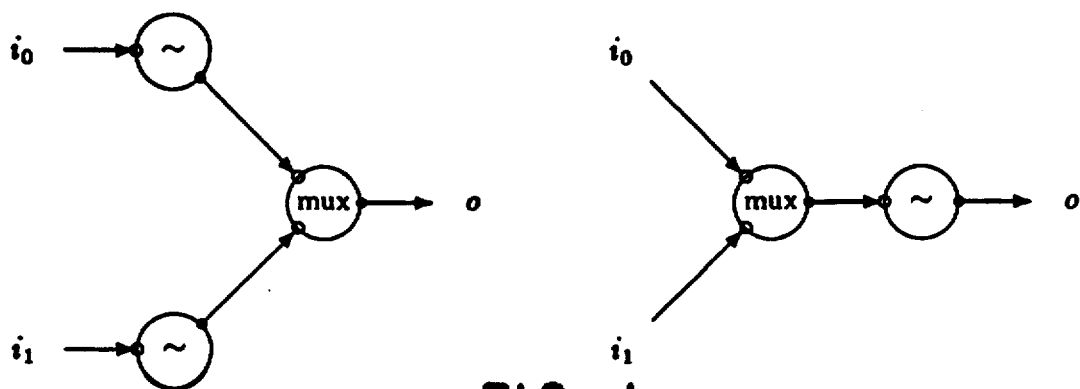
Figure 4B:
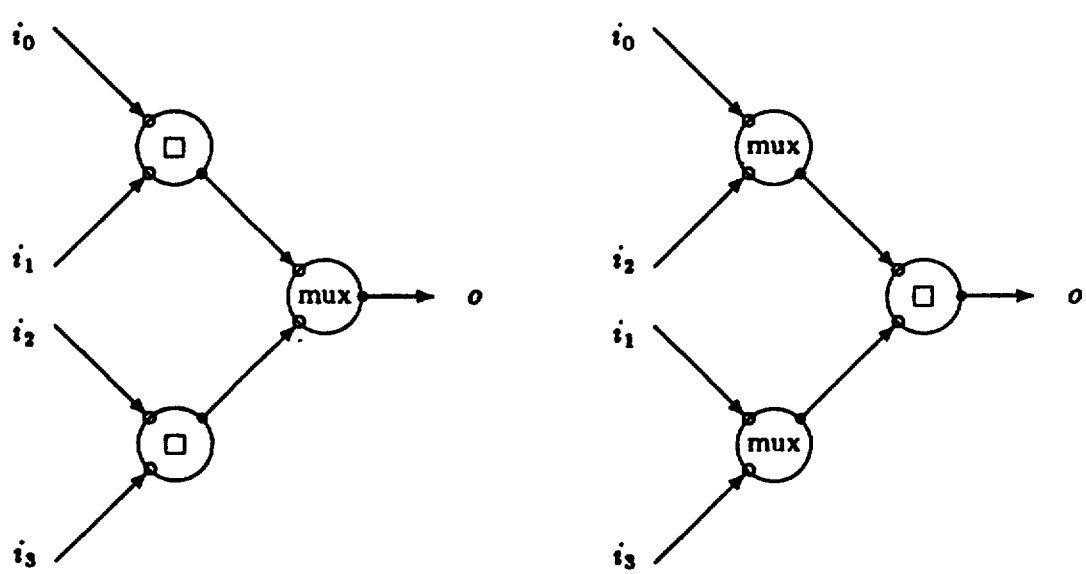
Figure 4C:
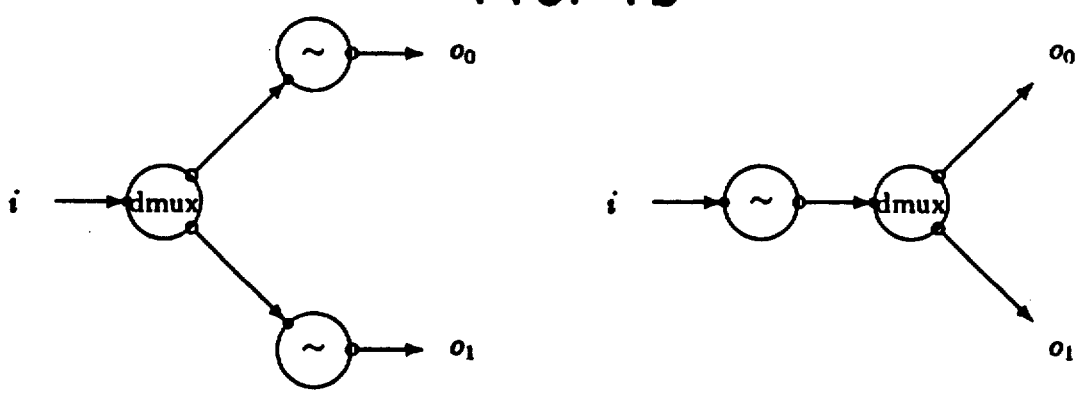
Figure 5A:
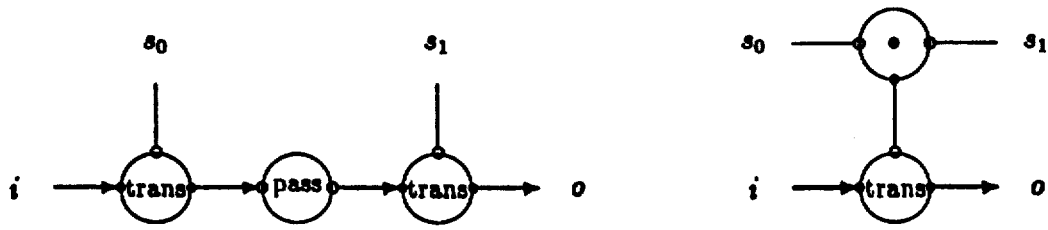
Figure 5B:
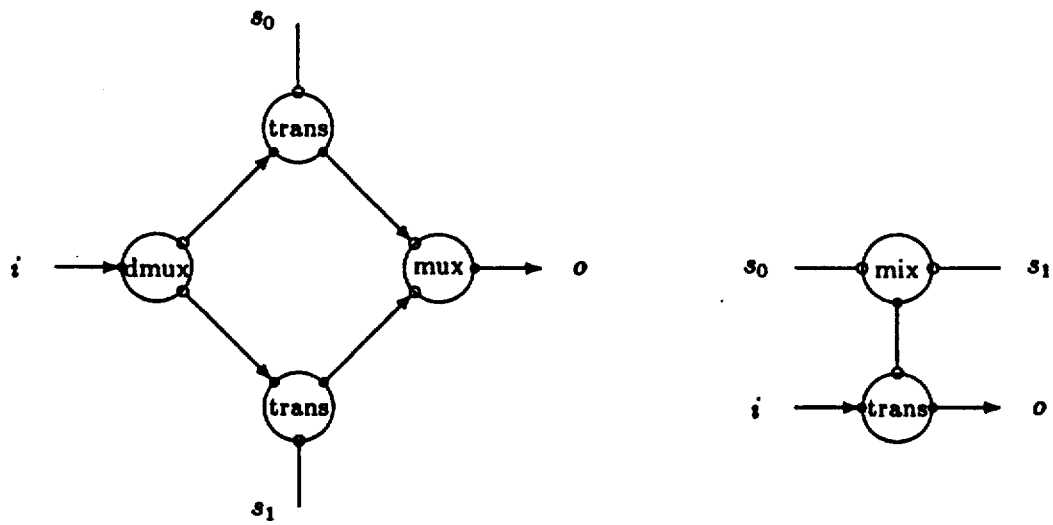
Figure 5C:
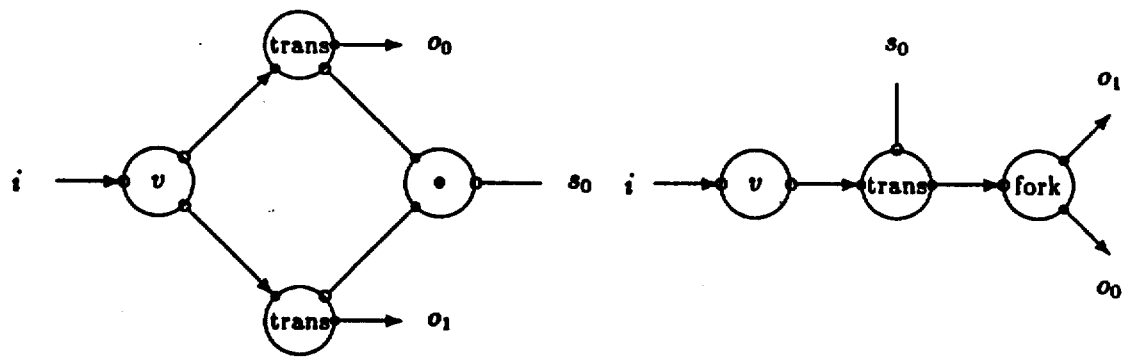
Figure 6A:
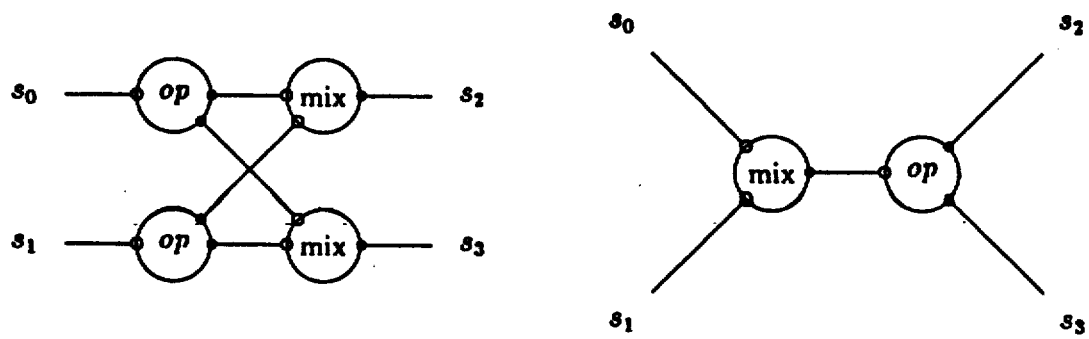
Figure 6B:
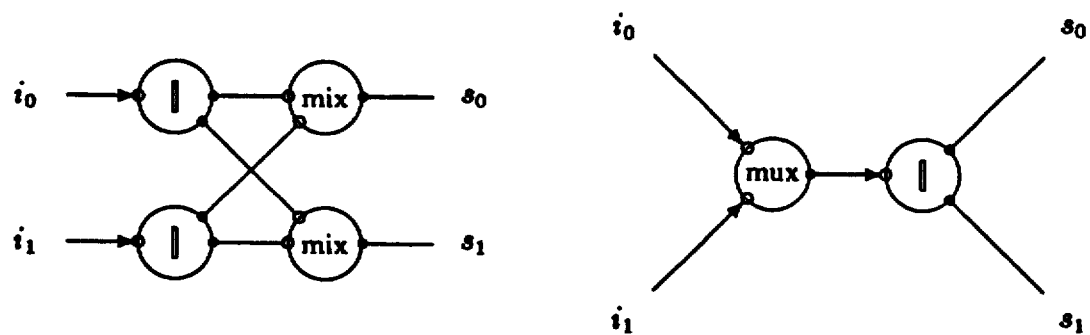

FIGS. 4a ... 4c, 5a ... 5c and 6a, 6b give examples of elementary transformations. FIGS. 4a ... 4c show examples of sharing passive-expression commands. FIGS. 5a ... 5c show examples of sharing transferrers. FIGS. 6a, 6b show examples of sharing control structures. In FIG. 6a, basic component op may be a sequencer, concursor or synchronizer. Each figure presents a pair of equivalent circuits. Whether the lefthand or the righthand circuit is cheaper depends on the cost criterion at hand; for most realistic cost criteria the righthand circuit is cheaper.

5.3.3 Transformation Sequences

Abstract-circuit optimization is carried out as a sequence of elementary transformations, such that the final circuit is cheaper than the original one. For a given abstract circuit many of such sequences exist; finding a sequence that yields the optimal abstract circuit is generally a very hard problem. There are two reasons for this:

Generally more than one elementary transformation is applicable; the choice of one transformation may disable another, and may subsequently allow new transformations that would not arise otherwise.

Often cost-increasing transformations are required to arrive at cheaper final results; generally, the costs do not decrease monotonically along a transformation sequence.

A simple and effective (but not optimal) strategy to compute an optimizing transformation sequence is the following so-called greedy algorithm: successively perform randomly-selected cost-improving elementary transformations until no further cost-improving transformation is applicable.

6 Concrete-Circuit Synthesis

Concrete-circuit synthesis is the transformation of an abstract circuit into an equivalent concrete circuit. An abstract circuit and a concrete circuit are equivalent when their behaviors at their respective external channels are indistinguishable apart from the distinction between intervals and so-called handshake sequences. Electrical handshake sequences are introduced as a refinement of CP-1 intervals, analogously to the introduction of CP-1 intervals as a refinement of CP-0 events.

For the transformation of abstract circuits into concrete circuits there are several options, depending on the desired type of concrete circuits (with respect to timing organization, technology etc.). The transformation consists of two successive sub-transformations:

1. the translation of an abstract circuit into an "equivalent" concrete circuit;
2. the optimization of the concrete circuit into an "equivalent" but "cheaper" concrete circuit.

Both steps, as well as the notions "equivalent" and "cheaper" will be discussed. On the one hand, we will describe general aspects that hold for any concrete-circuit type option. On the other hand, we will describe specific aspects for an exemplary transformation of abstract circuits into concrete circuits, viz. a transformation into delay-insensitive concrete circuits.

Delay-insensitive circuits are introduced first.

6.1 Delay-Insensitive Circuits

Delay-insensitive circuits are circuits that operate for any combination of delays of individual gates and wires.

In delay-insensitive circuits, all communication is realized by means of voltage transitions on wires. Maintaining sequence relations independently of delays is achieved by establishing causality relations between respective groups of transitions. In general, synchronization and communication require signaling along closed loops of interconnected wires and gates.

In our exemplary concrete-circuit synthesis we use delay-insensitive circuits for a number of reasons:

Communication by way of voltage transitions and the absence of clocks are conceptually close to interval communication in abstract circuits.

Compilation into delay-insensitive circuits keeps functional and physical correctness separated up to the concrete-circuit level. For example, typical synchronization problems such as glitches and clock skew are avoided. Also, delay-insensitive circuits appear to be robust with respect to process parameters and operating conditions.

Layout synthesis can be easier, because parasitic delays do not affect the correct operation of the circuit.

Delay-insensitive circuits tend to be faster because their speed is based on average-case behavior, whereas the speed of synchronous circuits is based on worst-case behavior. Also, power consumption is low, since only relevant voltage transitions can occur.

Full delay-insensitivity on the transistor level or gate level cannot be established. At these levels some, though very few, local assumptions about delays are indispensable. These assumptions are covered by the concept of isochronic regions (containing a few interconnected gates) in which some delays are negligible with regard to others. Delay-insensitive circuits, including isochronic regions, can be composed from the following elements:

wires with arbitrary finite delays;

so-called isochronic forks that have a negligible difference between the delays of all respective outputs;

simple logic gates with finite symmetrical delays with regard to the respective inputs.

Circuits built from other types of gates are easily transformed into circuits with gates having the above symmetry property.

Where we draw delay-insensitive circuits we use whichever gates are convenient. We use one special element, which occurs very often in delay-insensitive circuits: the so-called Muller C-element. [3] A C-element has one output and can have any number of inputs. Its output changes only if all inputs have the opposite value of the current output value, otherwise the output remains unchanged. The C-element is drawn as a circle with a 'C'. If more outputs are drawn, these represent the same signal.

[3] C. L. Seitz. System Timing. Chapter 7 in: C. A. Mead, L. A. Conway. Introduction to VLSI Systems. Addison Wesley, London Amsterdam Paris, 1980.

6.2 Translation

For every concrete-circuit type option the translation of an abstract circuit into a concrete circuit is straightforward in the following way:

1. Each channel of the abstract circuit is translated into a physical interconnection in the concrete circuit, i.e. a bundle of wires. The number of wires depends on whether values are communicated along the channel and, if so, the value width.
2. Each non-parameterized basic component of the abstract circuit is translated into a fixed sub-circuit of the concrete circuit.
3. Each parameterized basic component of the abstract circuit is translated into a sub-circuit of the concrete circuit that is composed of a number of fixed circuit parts in a regular way.

We will discuss each of the above-mentioned aspects in turn.

6.2.1 Channels

For every circuit type option one has to define how communication intervals are implemented in terms of electrical signals. For clocked circuits a signal would be expressed in terms of the voltage level on a wire at the moment of a clock "tick". For delay-insensitive circuits a signal is expressed in terms of a voltage transition on a wire. The relation between intervals and signals is given by a protocol which specifies:

1. how many wires are used for communication on a channel (depending on whether values are communicated and, if so, the value width): since an interval is initiated by the active side of a channel and terminated by the passive side of a channel, there have to be two groups of wires, one for signaling from each respective side to the other side;
2. how synchronization is achieved, i.e. how signals on both groups of wires are related in time;
3. how values are encoded in terms of signals.

The protocol defines a sequence of signals for each interval. Such a sequence is called a handshake sequence.

For delay-insensitive circuits several protocols are feasible. For our exemplary concrete-circuit synthesis we use the following protocol:

1. Nonput channels correspond with two wires, one from each respective side of the channel to the opposite side. Input-output channels of width n are translated into a bundle of 2n wires from output to input plus a single wire from input to output.
2. Synchronization is realized by so-called four-phase signaling: in the first phase the active side initiates voltage transitions on its electrical output wires, in the second phase the passive side causes transitions on its electrical outputs, in the third phase the active side reverses its transitions (so that the initial state is reestablished on its electrical output wires), and in the fourth phase the passive side reverses its transitions. The first phase corresponds with the begin of a CP-1 interval and the fourth phase corresponds with the end of a CP-1 interval.
3. For value encoding the so-called double-rail code is used. Each data bit corresponds with a pair of wires: a transition on one wire indicates the value '0', a transition on the other indicates the value '1'.

6.2.2 Basic Components

Consider the CP-1 command of a basic component. From this command follows a (partial) order of events (viz. the events corresponding with the begin and end of communication intervals). From this (partial) order we can derive a (partial) order of handshake signals, because the protocol for a circuit type option directly relates intervals and handshake sequences. Thus we can derive for each basic-component command a so-called handshake expansion describing its behavior in terms of handshake signals. This handshake expansion serves as a specification for the concrete circuit of the basic component. Translation of a basic component yields a sub-circuit that is an implementation of this specification.

In our exemplary case of delay-insensitive concrete-circuit synthesis, concrete circuits are specified by handshake expansions in terms of voltage transitions on port wires. They are implemented by delay-insensitive sub-circuits. The delay-insensitive protocol for communications between sub-circuits then guarantees that the entire concrete circuit is delay-insensitive.

Figure 7:
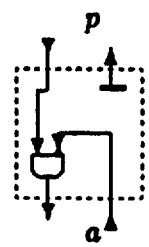

Non-parameterized basic components are translated into fixed sub-circuits. A very simple example is given in FIG. 7: the delay-insensitive concrete sub-circuit for a rep component.

Figure 8:
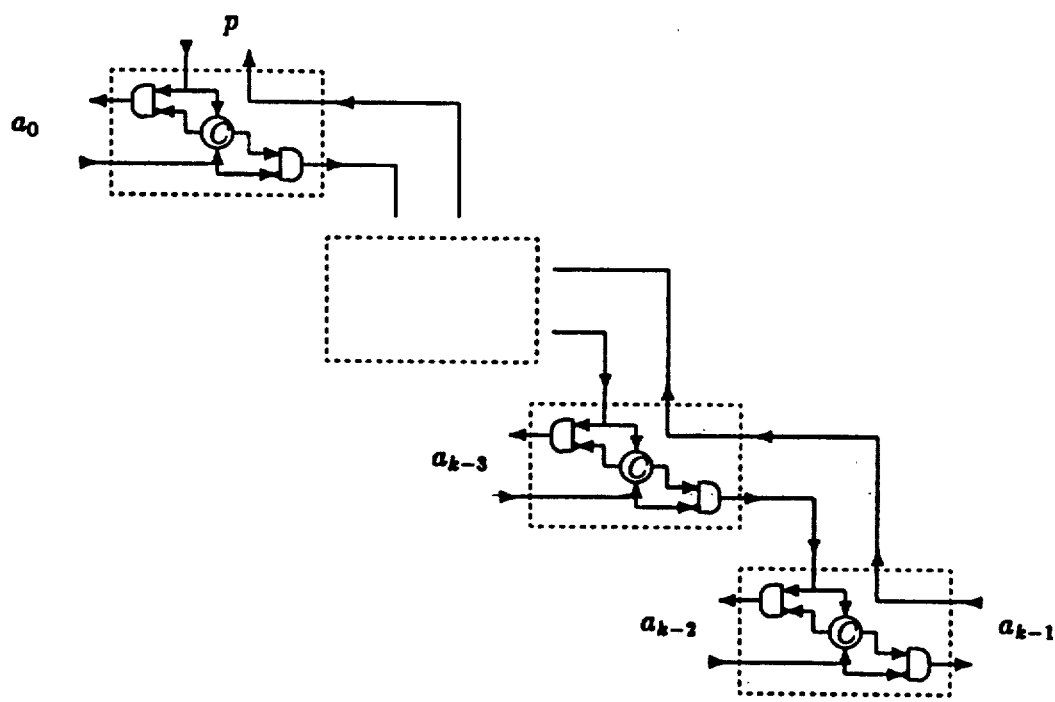

Parameterized basic components are translated into sub-circuits that depend on the actual values of the parameters. For each basic component there is a simple scheme for constructing the sub-circuit for given parameter values from a small number of fixed circuit parts. As an example, FIG. 8 illustrates how the sub-circuit for a seq(k) component is constructed from k—1 identical circuit parts.

6.3 Optimization

Translation of an abstract circuit results in a concrete circuit that is a composition of concrete components corresponding with basic components. Optimization is a transformation of the circuit into an equivalent but "cheaper" circuit. In the resulting concrete circuit one can in general no longer directly identify sub-circuits and interconnections as counterparts of basic components and channels.

We consider a number of elementary circuit transformations that consist in replacing small sub-circuits by equivalent sub-circuits. An optimization is a sequence of such transformations that results in a circuit with lower cost according to some cost criterion.

The cost criterion may be any function from concrete circuits into real values. It usually reflects the size and/or speed of the circuits in a given technology, e.g. CMOS.

The set of possible circuit transformations strongly depends on the circuit type option. For instance, using extra timing assumptions (e.g. in case of globally clocked circuits) may reduce the required signaling (yielding more efficient circuits).

Simple examples of elementary circuit transformations in the case of delay-insensitive concrete-circuit synthesis are: the elimination of inputs directly connected to ground, the elimination of double inversion, the application of the de Morgan rules (under certain conditions with regard to isochronic forks etc.).

7 Example

Hereinafter, an exemplary application of the silicon-compilation method is described.

7.1 Buf2

The example for compilation is a two-place buffer, called Buf2. A buffer is a component with one input port i and one output port o. It reproduces input values at the output in the same order: the stream of values at its output is a so-called prefix of the stream of input values. A two-place buffer is a buffer for which output events may lag at most two behind the input events: the length of the output stream is at most two less than the length of the input stream.

Figures 9, 10, 11:
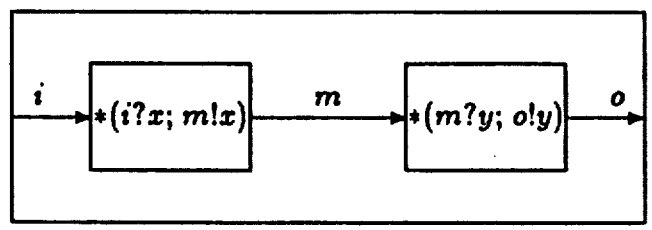

The CP-0 program for Buf2 is given in FIG. 9. It is a parallel composition of two sub-commands that have the same structure, viz. the structure of a one-place buffer. Therefore, Buf2 can be thought of as a cascade of two one-place buffers connected by an internal channel m. This is illustrated in FIG. 10.

The operation of Buf2 can be understood as follows. Both sub-commands can only begin with an input action. However, input from the internal channel m is not yet possible, since it must coincide with output on m. Therefore, the very first action must be input on port i, and the input value is stored in variable x. The second action can only be an internal communication on m with the effect that variable y is assigned the value of x. Subsequently, input of a new value on i and output of the value of y on o can be done in any order (even in parallel). After completion of both actions, another internal communication on m is done, and so on.

7.2 Abstract-Circuit Synthesis for Buf2

Application of the three abstract-circuit synthesis steps for Buf2 yields:
1. Translation of the CP-0 program (FIG. 9) into the corresponding CP-1 program given by FIG. 11. For the internal channel m occurring in the CP-0 program a pass basic component plus two new channels $m_0$, $m_1$ are introduced in the CP-1 program.
2. Decomposition of the CP-1 program (FIG. 11) into basic components is illustrated in FIG. 12. In FIG. 12 a decomposition step that decomposes command S* into S*$_0$, S*$_1$ is indicated by:

$$\begin{array}{l} S^* \\ \longmapsto \{\text{stepdescription}\} \\ S^*_0, S^*_1 \end{array}$$

Figure 13:
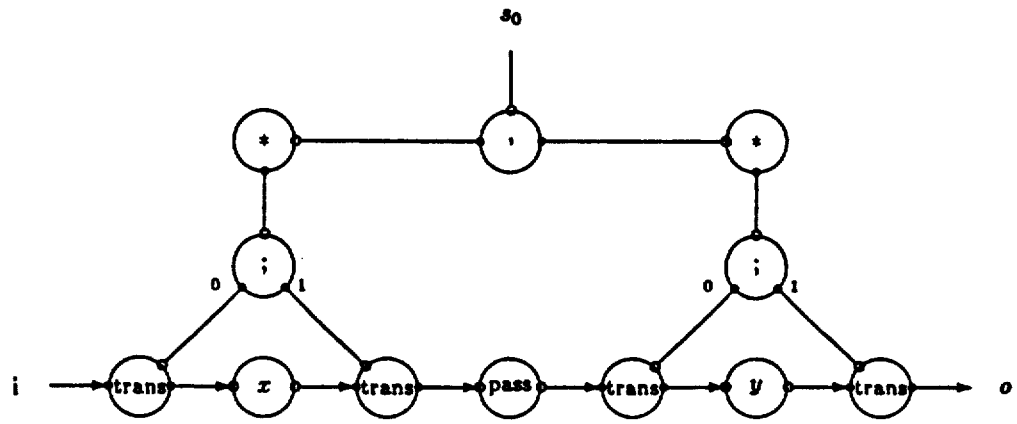
FIG. 13 is a graph representation of the abstract circuit derived in FIG. 12.
Figure 14:
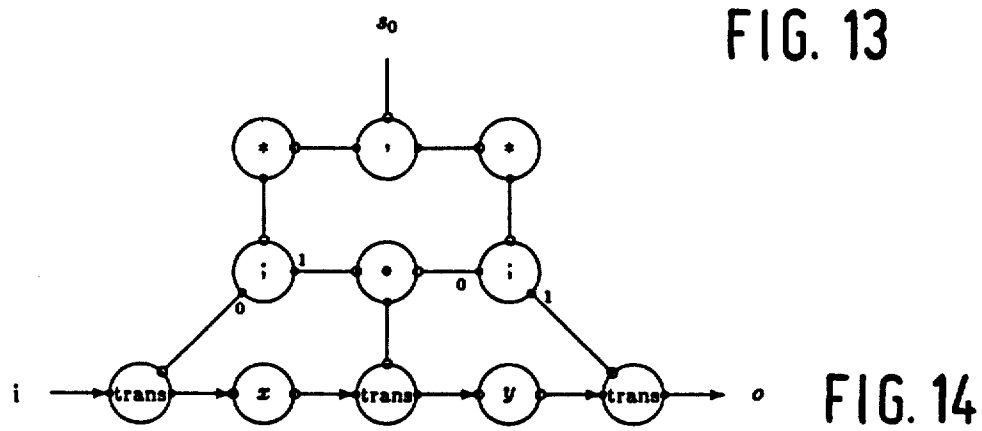
FIG. 14 is the result of optimization applied to the abstract circuit of FIG. 13.

The basic components that result from decomposition have been indicated, e.g. conc($s_0$, $s_1$, $s_2$) for (s*$_0$:(s*$_1$, s*$_2$))*. The resulting abstract circuit is drawn in FIG. 13.
3. Optimization of the abstract circuit from FIG. 13 yields the abstract circuit in FIG. 14. The optimization consists of a single transformation that replaces the combination of a pass component with two trans components on either side by a single trans controlled via a sync component (cf. FIG. 5a).

7.3 Concrete-Circuit Synthesis for Buf2

Figure 15:
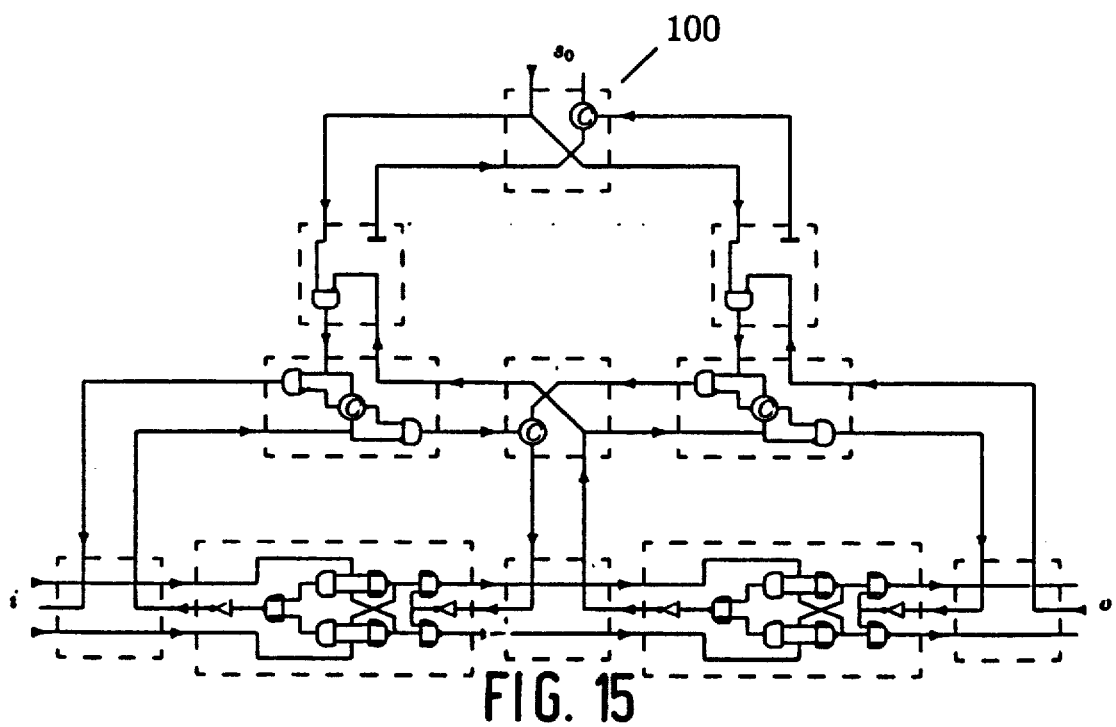
FIG. 15 is the concrete-circuit realization with respect to FIG. 14.

For concrete-circuit synthesis we assume a width of 1 bit for the variables and value-communication channels. Delay-insensitive concrete-circuit synthesis then results in:
1. Translation of the abstract circuit from FIG. 14 yields the concrete delay-insensitive circuit in FIG. 15. Each sub-circuit in FIG. 15 enclosed by a dashed box corresponds with a basic component in FIG. 14. The set of sub-circuits thus constitutes a library. For brevity, no listing of other library elements is provided. By itself, translation by means of one-to-one libraries is well-known.
2. Optimization of the concrete-circuit in FIG. 15 would for example consist in the elimination of the C-element in the topmost sub-circuit 100: because both inputs of the C-element are connected to ground, the $s_0$ output wire can be directly connected to ground.

We claim:
1. A silicon-compiler method for executing a silicon-compiler program comprising the following sequence of steps:
   a. a source-analyzer step having a sequence of sub-steps for:
      a1. receiving a source text expressing an algorithm in a first imperative concurrent computer language having concepts including an explicit parallelism construct, an explicit sequentialism construct and an explicit communication construct, said communication construct stipulating a communication action that is represented as a time interval and is either active or passive for execution on the active or passive side of a program channel, respectively;

a2. converting said received source text under execution of lexical analysis, syntactic analysis and semantic analyis into a structure-tree (as an abstract) representation of the source text and defined according to said concepts;

b. an abstract-circuit synthesizer step for converting said structure-tree representation into an abstract-circuit representation that is a network of basic components interconnected by abstract channels, each such basic component representing an elementary program execution and each abstract channel representing an associated program channel featuring in exacty two elementary programs interconnected thereby;

c. converting said abstract-circuit representation into a concrete-circuit representation as constrained by timing-organization requirements, circuitry-type requirements and technologic-realization requirements, while one-to-one translating each abstract channel into a wire set of the concrete circuit, and each basic component of the abstract circuit into an elementary electronic circuit, linked by at least one wire set to another electronic circuit;

d. converting said concrete-circuit representation into a very large-scale integrated-circuit lay-out while implementing at least one low-level task of providing an elementary circuit element not specified by said concrete-circuit representation but mandated by an electrical property of an in-layout passive part.

2. A silicon-compiler method as claimed in claim 1, wherein said source analyzer step has an initial step for a0. receiving said source text in a second imperative concurrent computer language wherein said communication construct stipulates said communication action as an instantaneous event, and converting said source text to said first imperative concurrent computer language for presentation to substep a1.

3. An electronic circuit produced by applying a method according to claim 1 or 2, said electronic circuit comprising a plurality of electronic-circuit modules, each as a one-to-one representation of an associated basic component of an abstract circuit that counts at least the following interconnected basic components:

a. an n-bit variable with k read-ports for concurrent reading;

b. an n-bit passivator that is an n-bit wide interconnector between two active ports;

c. an n-bit transferrer for transferring a message from a passive port to another passive port;

d. a sequencer for sequentially executing a set of at least two commands;

e. a concursor for concurrently executing a set of at least two commands;

f. a repeater for executing a command infinitely often;

g. a boolean selector for choosing between a particular first command and a particular second command under control of a predetermined value of an incoming boolean message.

4. A silicon-compiler arrangement comprising a computer having a hierarchical silicon-compiler program comprising the following program modules:

a. a source-analyzer module having:

a1. first receiving means for receiving a source text expressed in a first imperative concurrent computer language having concepts including an explicit parallelism construct, and explicit sequentialism construct, and an explicit communication construct, said communication construct stipulating a communication action that is represented as a time interval and is either active or passive for execution on the active or passive side of a program channel, respectively;

a2. first converting means for converting the received source text under execution of lexical analysis, syntactic analysis and semantic analysis into a structure-tree (as an abstract) representation of the source text and defined according to said concepts;

a3. first outputting means for outputting a representation of said structure tree;

b. an abstract-circuit synthesizer module having:

b1. second receiving means fed by said outputting means;

b2. second converting means for converting said received structure-tree representation into an abstract-circuit representation that is a network of basic components interconnected by abstract channels, each such basic component representing an elementary program execution and each abstract channel representing an associated program channel featuring in exactly two elementary programs interconnected thereby;

b3. second outputting means for outputting a representation of said abstract circuit;

c. a concrete-circuit synthesizer module having:

c1. third inputting means fed by said second outputting means;

c2. third conversion means for converting said received abstract-circuit representation into a concrete-circuit representation as constrained by at least timing-organization requirements, circuitry-type requirements and technologic-realization requirements, while one-to-one translating each abstract channel into a wire set of the concrete circuit, and each basic component of the abstract circuit into an elementary electronic circuit linked by at least one said wire set to another elementary electronic circuit;

c3. third outputting means for outputting said concrete-circuit representation;

d. a layout-synthesizer module having:

d1. fourth inputting means fed by said third outputting means;

d2. fourth conversion means for converting said received concrete-circuit representation into a very large-scale integrated-circuit layout, while implementing at least one low-level task of providing such elementary circuit elements not specified by said concrete-circuit representation, but mandated by electrical properties of in-layout passive parts;

d3. fourth outputting means for outputting said large-scale integrated-circuit layout as a source for therefrom producing an integrated circuit.

5. A silicon-compiler arrangement as claimed in claim 4, wherein said abstract-circuit synthesizer module comprises a cost-attribute transformation device bidirectionally communicating with said second conversion means for assessing a performance of a predetermined basic component's environment and by modifying the latter environment in said abstract circuit improving the abstract circuit's cost attribute, while leaving the program executable thereby unchanged.

6. A silicon-compiler arrangement as claimed in claim 4, wherein said source-analyzer module comprises a front module for:
   a0. receiving said source text in a second imperative concurrent computer language wherein said communication construct stipulates said communication action as an instantaneous event, and converting said source text to said first imperative concurrent computer language for presentation to said first receiving means.

7. An abstract-circuit synthesizer module for use in a silicon-compiler arrangement as claimed in claim 4 or 6 comprising
   a. input means for receiving a representation of a structure-tree (as an abstract) representation of a source text expressed in an imperative concurrent computer language having concepts including an explicit parallelism construct, an explicit sequentialism construct, and an explicit communication construct, said communication construct stipulating a communication action that is represented as a time interval and is either active or passive for execution on the active or passive side of a program channel, respectively;
   b. conversion means for converting said structure-tree representation into an abstract-circuit representation that is a network of basic components interconnected by abstract channels, each such basic component representing an elementary program execution and each abstract channel representing an associated program channel featuring in exactly two elementary programs interconnected thereby, each elementary program being an element of a finite set of elementary programs of which at least the following modules are realized in said abstract circuit:
      b1. an n-bit variable with k read-ports for a given n and k;
      b2. an n-bit passivator that is an n-bit wide interconnector between two active ports;
      b3. an n-bit transferrer for actively transferring an n-bit wide message from a passive port to another passive port;
      b4. a sequencer for sequentially executing a set of at least two commands;
      b5. a concursor for concurrently executing a set of at least two commands;
      b6. a repeater for repeatedly executing a command infinitely often;
      b7. a boolean selector for choosing between a particular first command and a particular second command under control of a predetermined value of an incoming boolean message;
   c. outputting means fed by conversion means for outputting a representation of said abstract circuit.

8. A machine-generated abstract circuit as produced by an abstract-circuit synthesizer module as claimed in claim 7, said circuit being free of any directed cycle in its associated activity graph, said circuit comprising at least one of each of the following basic components: a k-read-port n-bit variable, an n-bit passivator, an n-bit transferrer, a sequencer, a concursor, a repeater, a selector, and at least one other type basic component.

9. A machine-generated abstract circuit as produced by an abstract-circuit synthesizer module as claimed in claim 7, said circuit being free of any directed cycle in its activity graph, said circuit comprising at least one of the following components: a k-read-port n-bit variable, an n-bit passivator, an n-bit transferrer, a sequencer, a concursor, a repeater, a selector, and at least one other type component, said abstract circuit representing a one-to-one convertible source information for conversion to an electronic concrete circuit.

10. An abstract-circuit synthesizer module as claimed in claim 7, furthermore comprising:
   a. a cost-attribute transformation device bidirectionally communicating with said conversion means for assessing a performance of a predetermined basic component's environment and by modifying the latter environment in said abstract circuit improving the abstract circuit's cost attribute, while leaving the program executable thereby unchanged.

11. A machine-generated abstract circuit as produced by an abstract-circuit synthesizer module as claimed in claim 10, said circuit being free of any directed cycle in its associated activity graph, said circuit comprising at least one of each of the following basic components: a k-read-port n-bit variable, an n-bit passivator, an n-bit transferrer, a sequencer, a concursor, a repeater, a selector, and at least one other type basic component.

12. A machine-generated circuit as produced by an abstract-circuit synthesizer module as claimed in claim 10, said circuit being free of any directed cycle in its activity graph, said circuit comprising at least one of the following components: a k-read-port n-bit variable, an n-bit passivator, an n-bit transferrer, a sequencer, a concursor, a repeater, a selector, and at least one other type component, said abstract circuit representing a one-to-one convertible source information for conversion to an electronic concrete circuit.

13. A reset-free electronic circuit produced by a method as claimed in claim 1 or 2 or by an arrangement as claimed in claim 4, 6 or 5, wherein each basic component that has both at least one active port and at least one passive port satisfies the following constraints:
   a. within a first finite amount of time after all electrical inputs of all passive ports are given a stable value zero, all electrical outputs of all active ports get the stable value zero; and thereafter, within a second finite amount of time after all electrical inputs of all active ports are given the stable value zero, all electrical outputs of all passive ports get the stable value zero, wherein each basic component that has only passive ports satisfies the following constraint:
   b. within a third finite amount of time after all electrical inputs of all ports were given the stable value zero, all electrical outputs of all ports get the stable value zero, and wherein its associated abstract-circuit representation satisfies the following constraints:
   c. it is free of any directed cycles in its associated activity graph
   d. each node in its associated graph is reachable from at least one external passive port.

* * * * *